United States Patent [19]

Langner et al.

[11] 4,415,851

[45] Nov. 15, 1983

[54] SYSTEM FOR CONTACTLESS TESTING OF MULTI-LAYER CERAMICS

[75] Inventors: Guenther O. Langner, Hopewell Junction, N.Y.; Hans C. Pfeiffer, Ridgefield, Conn.

[73] Assignee: International Business Machines Corporation, Armonk, N.Y.

[21] Appl. No.: 267,118

[22] Filed: May 26, 1981

[51] Int. Cl.³ .......................................... G01R 31/02
[52] U.S. Cl. .................................... 324/51; 324/71.3; 324/71.4; 324/158 R
[58] Field of Search .......... 324/51, 52, 158 R, 158 D, 324/73 PC, 71 EB; 250/305, 311, 492.1, 397

[56] References Cited

U.S. PATENT DOCUMENTS

| | | |
|---|---|---|
| 3,373,353 | 3/1968 | Harris . |
| 3,531,716 | 9/1970 | Tarui et al. . |
| 3,549,999 | 12/1970 | Norton . |
| 3,588,347 | 6/1971 | Montone et al. ............ 250/492.1 X |
| 3,678,384 | 7/1972 | Oatley . |
| 3,763,425 | 10/1973 | Engelke . |
| 3,764,898 | 10/1973 | Bohlen et al. . |
| 3,796,947 | 3/1974 | Harrod et al. ........................ 324/51 |
| 3,882,532 | 5/1975 | Quinn . |
| 3,961,190 | 6/1976 | Lukianoff et al. . |
| 4,139,774 | 2/1979 | Katagiri . |
| 4,164,658 | 8/1979 | Frosien et al. . |
| 4,169,244 | 9/1979 | Plows . |
| 4,172,228 | 10/1979 | Frosch et al. . |
| 4,199,688 | 4/1980 | Ozasa . |
| 4,287,473 | 9/1981 | Sawyer ...................... 324/158 D X |

OTHER PUBLICATIONS

Elliot, Locating AC Faults in LSI Chips, IBM Tech. Disl. Bull., Sep., 1976, pp. 1485, 1486.
Morrissey, Scanning Electron Microscope Stage for Testing Integrated Circuits, IBM Tech. Discl. Bull., Dec. 1980, pp. 2803, 2804.
Kirkman, Integrity Testing, IBM Tech. Disl. Bull., Nov. 1976, p. 2225.
Lancaster, Dual Electron Beam Testing Probe, IBM Tech. Discl. Bull., Dec. 1969, p. 978.
Rubloff, Contactless Testing by Commercial E-Beam, Instruments, IBM Tech. Discl. Bull., Oct. 1980, p. 2150.
Chang, Electron Beam Addressable Liquid-Crystal Display With Storage Capability, IBM Tech. Discl. Bull., Jun. 1973, pp. 353, 354.
Posa, Electron Beam Finds, Memory Faults, Reconfigures Chips, Electronics May 1981, pp. 37, 38.
Gill et al., Contactless Probing of Hybrid Substrates, International Journal for Hybrid Micro-Electronics, 1979, pp. 254 ff.

Primary Examiner—Stanley T. Krawczewicz
Attorney, Agent, or Firm—Sughrue, Mion, Zinn, Macpeak, and Seas

[57] ABSTRACT

A system of testing the continuity of electrical conductors extending through an insulating layer without contact. A flood gun irradiates one side of the body to charge the exposed conductors to a given potential. A steerable electron beam scans the front side to generate secondary electron emission from those conductors. The secondary emission is enhanced from conductors with conductivity between front side and back side as a result of the surface potential established by the rear flood beam. The secondary emission varies depending on the state of continuity in the three dimensional network of conductors and produces signals at the detector which allow clear discrimination between uninterrupted and interrupted conductors. The system is applicable for unfired ceramics where contact destroys the specimen.

17 Claims, 3 Drawing Figures

SYSTEM FOR CONTACTLESS TESTING OF MULTI-LAYER CERAMICS

BACKGROUND OF THE INVENTION

1. Field of Invention

This invention relates to testing the continuity of electrical conductors without any physical contact. In particular, this invention relates to a system of using a flood gun on one side of a body to be tested to charge conductors to a given potential together with a scanning electron beam on the opposite side to scan the conductors and detect secondary electron emission from those conductors having electrical continuity between front and back side. The system is employed to test multi-layer ceramic (MLC) laminates prior to firing, sublaminates, and greensheet material.

2. Prior Art

Cost and yield considerations in the manufacture of integrated circuit semiconductor devices mandates the definition of a system to test for defects at an early point in the manufacturing process. Due to the extreme miniaturization in the size of these devices, and the conductors used, conventional electrical testing techniques employing contactors at conductor ends has become increasingly difficult. The high density of conductor ends, uneven leveling and their close proximity to each other are all factors contributing to this difficulty. Moreover, such testing conventionally occurs at a point, generally after firing, in the manufacturing process where significant costs such as heat processing have already occurred. Discarding a module at that manufacturing point is not cost effective. Additionally with the introduction of multi-layer packaging, MLC devices, conventional optical tests can no longer be performed to determine the continuity of conductor lines. Such optical techniques are limited by resolution and a general inability to detect certain types of line and microsoket (via) defects.

The difficulties in testing these devices is compounded by the inherent nature of the conductive material. The conductive material deposited or unfired ceramic substrates (greensheets) has a paste-like consistency posing the risk that physical contact destroys the specimen during testing by introducing surface defects not previously disposed in the material. Accordingly, visual, as well as automatic inspection of a single greensheet has been used to detect surface defects in the greensheet material. These defects include erroneously punched or missing via-holes, incompletely filled via holes and defects in screened connection lines. Such testing is not effective to determine electrical defects such as shorts and opens.

Individual greensheets are subsequently pressed together to form laminates. Defects can occur at this point in the manufacturing process such as opens in the via-connections, opens in the horizontal line connections and shorts between lines. Following lamination, the greensheets are fired in kilns to produce a multi-layer ceramic MLC substrate.

Given these processing steps, testing subsequent to firing, when the material is more easily handled, results in discarding defective modules at a point in the manufacturing process that is not cost effective. In contrast, testing prior to firing, while preferred on a cost basis, has been generally unsatisfactory due to the nature of the conductive material, a paste, and also the deficiencies in existing testing technology.

In order to avoid these difficulties, electron beam testing has been proposed. The prior art is replete with a number of electron beam techniques for electrical continuity testing of semiconductor devices. U.S. Pat. No. 3,373,353 relates to the testing of sheets of dielectric material and particularly to the achievement of local measurements of thickness for detecting thickness defects. A low energy scanning electron beam charges the surface to cathode potential in a manner compatible with photoconductive target charging in a vidicon camera tube. The current across the dielectric layer to its conductive backing is measured with an electronic potential directly applied to a conductive backing on the substrate thereby generating a potential difference across the dielectric. Hence, surface contact at the conductive backing portion is essential.

U.S. Pat. Nos. 3,763,425 and 3,765,898 both relate to non-contact continuity testing of conductors utilizing electron beams. Both measure the resistance of connecting conductors on or embedded in an insulating matrix. A pair of individually controlled electron beams are used which must simultaneously address both ends of the conductor under test. In both patents, special masks are employed, individually tailored to each configuration of conductors of the specimen under test. As shown, for example, in FIG. 3 of the '898 patent, the mask may be a complex structure making loading and unloading of specimens difficult, thereby inhibiting thruput in manufacture. In both patents, the masks stabilize the potential on the specimen surface and act as collecting and measuring electrodes. In the case of the '425 patent, the masks are used to generate secondary electrodes for excitation of the target. Optimization of the operating parameters of the system can be attained but, however, with a penalty of interference in the changing of specimens due to the use of such masks. Other systems utilizing mask techniques include U.S. Pat. Nos. 3,678,384 and 4,164,658.

The prior art also includes a number of proposals to use electron beam techniques in diagnostic analysis of electronic circuits. Some techniques are contactless and others are not. U.S. Pat. No. 4,139,774 relates to an electron beam apparatus that eliminates specimen staining which is caused by contamination in vacuum pumps. The system is designed for specimen surface analysis and not electrical testing. U.S. Pat. No. 4,172,228 utilizes a scanning electron microscope SEM to irradiate selected areas of an integrated circuit until failure occurs. U.S. Pat. No. 4,169,244 relates specifically to electron probes for testing electronic networks. The system requires electrical stimulation of the unit under test by means of external electronics.

I.B.M. Technical Disclosure Bulletin, Vol. 12, No. 7, December, 1969 discloses in very general terms the use of two separately controlled but simultaneously active scanning electron beams. The system is therefore similar to that disclosed in U.S. Pat. Nos. 3,763,425 and 3,764,898. The beams are focused at two distinct points in the array and the potential which exists at one energizing point is measured by capturing scattered secondary electrons with a pickup and measuring device.

I.B.M. Technical Disclosure Bulletin, Vol. 23, No. 5, October 1980, discloses a system that generates a voltage contrast at test points of a specimen utilizing a scanning Auger microprobe (SAM) or a scanning electron microscope (SEM) by biasing the specimen. The testing of IC chips occurs where the biasing corresponds to binary zero and one logic levels. Although the system is contactless and utilizes a commercially available electron beam instrument, it is not suited for testing large area specimens having a dielectric matrix or when physical electrical connections to the specimen are not present. Another SEM technique for testing IC chips is disclosed in I.B.M. Technical Disclosure Bulletin, Vol. 23, No. 7A, December 1980. The system is not contactless, utilizing multiple connections to the chips on a module to drive them. The system is therefore not suitable for soft uncured multi-layer ceramic materials.

Accordingly, within the known technology of testing, multi-layer ceramic laminates, sublaminates and greensheets, a requirement still exists to define a system to determine the conductive nature of an uncured specimen without actually contacting the device. Additionally, testing should take place at a rate commensurate with other processing steps to enhance thruput. Testing should also take place at a point in the manufacturing process where defective modules may be discarded prior to subjecting them to significant manufacturing costs.

SUMMARY OF THE INVENTION

It is therefore a primary object of this invention to provide a system of non-contact testing of uncured semiconductor material to ascertain defects at an early point in the manufacturing process.

Another object of this invention to test continuity and open circuit conditions in a layer of conductive material which is in paste form, without contact, prior to firing, so that defective modules can be removed prior to subsequent expensive manufacturing steps.

Yet another object of this invention is to define a method of testing multi-layer ceramic laminates, sublaminates, and greensheets without physical contact to discriminate between conducting and open states or, measure electrical resistance.

Still another object of this invention is to define a system utilizing a scanning SEM beam on one surface of a material and a second, high energy flood beam on an opposite surface of the material to generate an electrical potential used to determine the existence of an opened via.

These and other objects of this invention are achieved by the use of a flood gun arranged facing a surface of material to be tested opposite the surface scanned by a scanning gun of an electron beam microscope. The electric beam from the SEM optical column is deflected by means of a deflection yoke to provide scanning of the total area of the specimen in a rapid and efficient manner. The flood gun, arranged in the rear of the specimen, has a wide angle beam and an energy level higher than the SEM beam. The absolute values of the acceleration potentials and currents of the two electron guns are correlated so that the deflection and duty cycle of the scanning beam and the potentials of a retarding electrode of a detector of the field are aligned. A secondary electron detector positioned not to impede electron beam deflection, senses secondary electron emission. This output signal is used to produce a voltage contrast to allow discrimination between electrical conduction of conducting elements ranging from acceptable bulk conduction to complete interruption, that is, an open condition. The failure mode, an open circuit, is represented by an order of magnitude variation in resistance that is sensed as a voltage contrast output. The apparatus operates without any physical contact to the specimen under test.

DESCRIPTION OF THE PREFERRED EMBODIMENT

Figure 1:
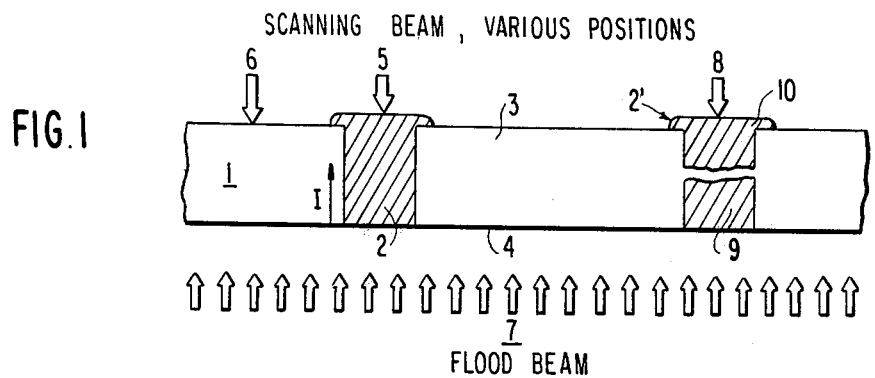
FIG. 1 is a schematic diagram in section showing the principle of operation of this system.

Referring now to FIG. 1, a schematic diagram illustrates the typical structure of a specimen under consideration for test. A matrix 1, formed of a dielectric material, may be a single greensheet, a laminate comprising a number of greensheets defining a sublaminate structure, or a complete multi-layer ceramic laminate sheet. The matrix of dielectric material contains a number of conducting elements 2 which normally extend from the front surface 3 through the layer to the rear surface 4. An important defect found in these specimens is an "open" condition in the conductor 2' wherein a break occurs dividing the conductor into an upper part 10 and a lower part 9. Discriminating between continuity existing in conductor 2 and an open condition existing in conductor 2' is a specific aspect of the present invention.

FIG. 1 shows the application of a scanning electron beam used as a probe in the measurement of electrical properties of the specimen. As indicated, SEM technology, as a scanning beam per se, has been employed within the prior art. The present invention, however, represents a significant departure from such prior art systems by completely avoiding any physical electrical contact with the specimen 1. The present invention utilizes a second beam, flood beam 7, positioned relative to the rear surface 4. The scanning beam on the front surface 3 is utilized in a typical SEM fashion to read out a signal from various locations on the specimen. These regions are indicated by areas 5, 6 and 8.

In accordance with the present invention, the rear flood beam 7 has an energy level different than the SEM beam on the front surface. Typically the rear flood beam may have a higher energy level. The system however operates at energy levels, about 2 kV, that are considerably lower than conventional SEM operations. Where the specimen has a thru connection, that is, an intact via, such as contact 2, the electrical potential which results from charging by the rear electrons is also maintained on the front surface due to ohmic conduction. This potential is more negative than that which exists in the case of an open via (conductor 2') where a break occurs denoting an open via 9, 10. The potential is also more negative than that existing within the matrix 1, giving rise to a higher level signal which appears as a bright point on a video screen. The generation of the contrast mechanism, especially the generation of the negative potential, involves secondary electron emission and will be described in more detail herein.

As shown in FIG. 1, the test location on the specimen 1 is determined by the scanning beam focused at different discrete regions. However, on the rear side, a broad angle, non-steered beam is used and is produced by a so-called flood gun. Flood beam electrons indicated as elements 7 in FIG. 1 in place of a steered beam allow for a simpler system. Flood guns per se are well known in CRT and storage tube devices. This invention may use such typical guns that are capable of wide angle emission to allow dispersion to the entire rear side of the specimen.

The flood beam emerging from flood gun 11 can be spread into two still wider angles by placing an electron lens, magnetic or electric between the flood gun and the rear of the target. This lens is excited such that the focal length is short when compared to the distance of the lens to the target.

Figure 2:
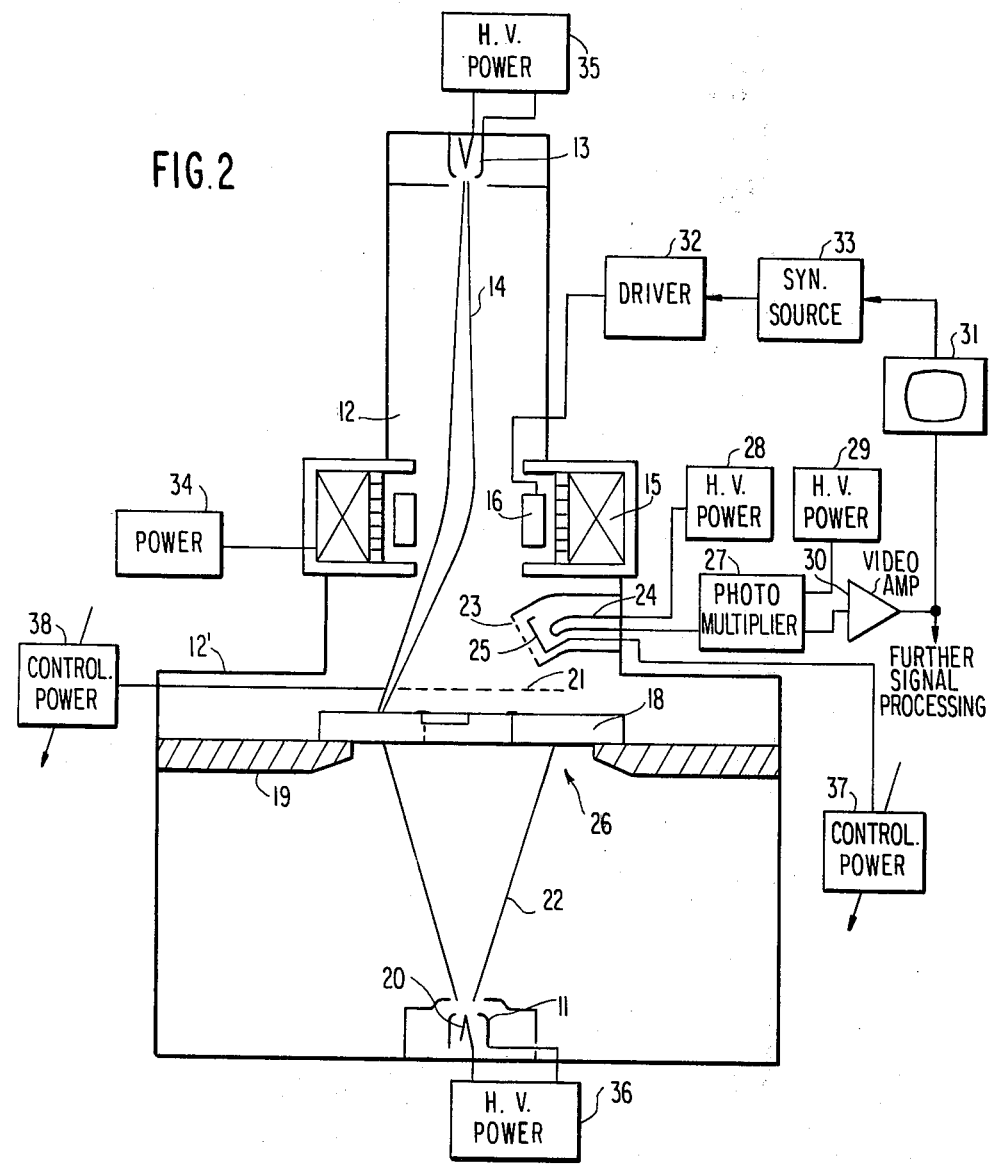
FIG. 2 is a schematic diagram showing the test apparatus.

Referring now to FIG. 2, a schematic of the overall apparatus used to practice this invention is shown. The specimen under test 18 is positioned on a support frame 19. Positioned above the specimen is a scanning electron microscope column 12 positioned integrally with a specimen chamber 121. The column 12 and chamber 12' are evacuated. The electron gun 13 is positioned at one end of the optical column 12 and emits an electron beam 14. The beam 14 is demagnified and focused by means of a lens 15 comprising a number of focusing coils. The lens mechanism 15 functions to demagnify and focus the crossover in the gun onto the surface of the specimen 18. Electron beam 14 is also deflected, that is, steered, by means of a deflection yoke 16 preferably located within the lens 15 and comprising a second series of coils. It is understood that the yoke 16 may be positioned outside the lens 15. If necessary, a second lens may be added to enhance beam focus before deflection takes place. Such electron beam focussing and steering is known in large scale integrated circuit lithography. Typical systems are reported in the literature, see H. C. Pfeiffer, "New Imaging and Deflection Concept for Probe Forming Microfabrication Systems." J. Vac. Sci. Technol., Vol. 12, p. 1170 (1975). These devices permit resolution for a given field size and working distance from the gun 13 to the specimen. An extraction grid 21 is disposed over the surface of the specimen 18.

A detector 24 for secondary electron emission is located relative to the specimen 18 within the optical column 2 so that it does not impede electron beam deflection. The detector, however, is located where it can be reached by electrons for every position of the specimen surface within the deflection field of the beam 14. Such detectors are well known in SEM technology. While one detector is illustrated, it is understood that multiple detectors positioned proximate to the scan field may be employed. A retarding electrode 25, located behind an entrance mesh 23, discriminates between electrons of different energies. This technique is also well known in SEM technology to produce a so-called "voltage contrast". The change in secondary electron emission imposed by charging or discharging electrons is detected as a strong voltage contrast which allows clear discrimination between open or continuity conditions. Reports in the literature of suitable detectors and electronics are found in Everhart and Thornley, "Wide-Band Detector for Micro-Microampere Low Energy Electron Currents", J. Sci. Instrum. 37 (1960) pp. 246-248.

As shown in FIG. 2, a flood gun 20 is arranged at the rear of the specimen 18. It produces a wide angle beam 22 irradiating the entire rear surface of the specimen through a sufficiently large window 26 in the support frame 19, to charge the specimen. In order to irradiate large areas or the whole of the specimen without requiring a large distance between flood gun 11 and the specimen, an electron lens may be used in front of the flood gun which magnifies the angle of the beam.

FIG. 2 also includes the electronic power supplies, signal generators and amplifiers to operate the electron beam column. Part of the secondary electron detector is a photomultiplier tube 27 with associated high voltage supply 29. The output signal is amplified by a video amplifier 30 and either processed further and/or displayed on a monitor 31. The secondary electron detector requires still another high voltage power supply 28 to provide an acceleration potential for the scintillation detector 24. The deflection yoke 16 is driven by signals provided by the driver 32. A synchronization source 33 synchronizes the beam deflection and the t-v display 31.

A further power supply 34 is necessary to excite the projection lens 15 and an additional lens if necessary. Boxes 35 and 36 denote high voltage power supplies for electron guns 11 and 13 respectively. Additional controllable power supplies 37 and 38 are incorporated to permit the voltages at the retarding electrode 25 and the extraction grid 21 to be set. Each of the ancillary units identified above are known individually in the art.

In accordance with the present invention, beam scanning using the driver 32 and synchronization source may be either a conventional raster scan or a vector scan. In the latter case, the beam would be directed to specific predetermined locations, i.e., points 5 in FIG. 1 to irradiate only the conductor vias.

By choice of operating parameters, acceleration potentials and currents to the electron guns, dwell time of the scanning beam, and the threshold potential of the secondary electron detector, discrimination by means of the generated signal can be utilized to determine electrical conduction of the vias in the specimen. During scanning, secondary electrons are generated in the scanned areas, charged by the flood guns. Determinations can be made ranging from acceptable levels of bulk conduction to the existence of an open condition, that is, complete interruption. The system operates without any physical electrical contact to the specimen 18. This is accomplished by having the signal generated by the secondary and back-scattered electrons picked up by the detector 24. The energy of these electrons must be high enough to overcome the threshold potential which is applied to the retarding grid 25 and the output is employed, for example to modulate a CRT display 31. In an automatic test system, further processing of the output would take place. A computer would be employed for on-line processing of the specimen and would direct column operations including scanning to provide the coordinates of any defect location in the specimen.

Figure 3:
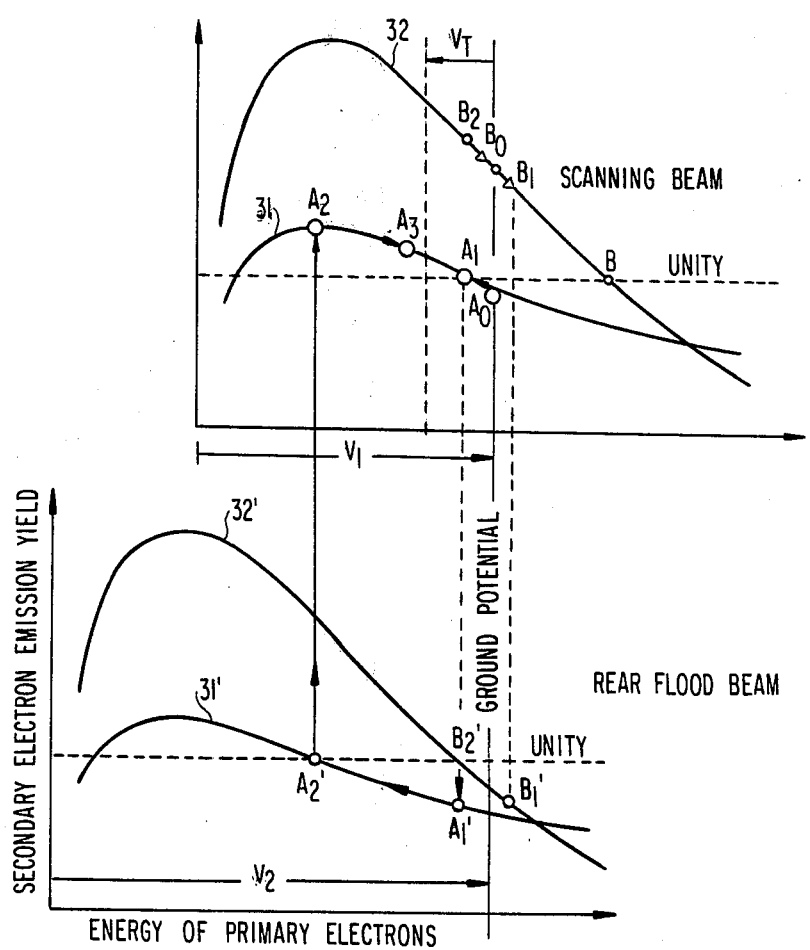
FIG. 3 is a graph showing secondary emission yield curves for typical materials to be tested.

Referring now to FIG. 3, the technique of controlling the electrical potential on the specimen by the flood gun beam is presented. Control is accomplished so that the energy of the secondary electrons emitted from the different elements on the specimen surface provide an unambiguous indicator of continuity or open circuit conditions from the front of the specimen to the rear. FIG. 3 shows secondary emission yield curves showing the ratio between the numbers of secondary and primary electrons. The yield curves 31, 31' and 32, 32' are typical for materials employed in these elements. These curves qualitatively illustrate the relationship between the materials at unity values well known in the literature. Curves 31, 31' represent molybdenum typically used in the paste for the conductor and curves 32, 32' are for a typical insulator such as $Al_2O_3$ which is used in the greensheet material. The upper set of curves 31, 32 are referenced to the acceleration potential $V_1$ of the scanning beam and the lower set of curves 31', 32' are referenced to the acceleration potential $V_2$ of the rear flood beam. Details on secondary electron emission and yield curves are well known in this technology and are referenced, for example, in Kollath, "Sekundarelektronen-Emission Fester Korper Bei Bestrahlung mit Elektronen.", in *Encycl. of Phys.*, Vol. 21, 1956, pp. 232–303.

A crucial aspect of the curves shown in FIG. 3 is the energy of the primary electrons at the so-called "second cross-over point". These are shown in the upper set of curves at points $A_1$ and B. At this energy, the secondary electron emission yield is unity. Accordingly, if the target under electron bombardment is insulated or itself is an insulator, charging which occurs due to the difference between the primary electron beam current and the secondary electron emission current results in a shift of the surface potential toward this second cross-over point. This occurs because at the cross-over points, the difference is zero.

These points of unity yield ($A_1$, B) are stable potential points. If the environment collecting the secondary electrons is at a lower potential than that associated with the second cross-over point, this potential of the environment substitutes for the second cross-over point as a stable equilibrium potential.

As shown, FIG. 3 shows curves referenced to the acceleration potential $V_1$ of the gun 13 which produce the scanning beam 14. The curves 31 and 32 pertain to the front surface 3 of the specimen 18. The energy of the lower set of curves 31' and 32' is referenced to the acceleration potential $V_2$ of the flood gun 20 producing the wide angle beam 12. The curves 31' and 32' therefore pertain to the rear surface 4 of the specimen 18. FIG. 3 also shows a common reference of both curves as ground potential.

Under test conditions, initially the front and rear surface are at ground potential and the flood gun is turned off. The acceleration potential of the scanning beam gun 13 is chosen to be close to the second cross-over point $A_1$ of the conductor. This initial point is shown in FIG. 3 as $A_0$. The acceleration potential $V_1$ can also be slightly below $A_1$ but should always be closer to $A_1$ than to unity point B.

FIG. 3 shows point $B_0$ as a point on the curve 32 corresponding to the primary electron energy. During scanning, that is, from position 5 to position 8 in FIG. 1, a shift in potential occurs from point $A_0$ to $A_1$. This is shown by the right arrowhead on curve 31. Similarly, scanning over the dielectric surface, shown as position 6 in FIG. 1, shifts the potential toward B. However, due to the potential of the environment, that is, the extraction grid 21, only point $B_1$ may be reached.

In the case of direct coupling, that is, conduction shown as via 2 or capacitive coupling shown in an open condition due to broken via 9, 20 or from rear to front surface through the matrix, the potential on the rear surface will be exactly or approximately the same. Consequently, in the energy scale of the flood gun shown in the lower set of curves in FIG. 3, point $A_1$ becomes point $A_1'$ and point $B_1$ becomes $B_1'$.

The acceleration potential $V_2$ of the rear flood beam is chosen to be typically several hundred volts higher than $V_1$. Accordingly, when the flood gun is turned on, flood gun electrons, elements 7 in FIG. 1, charge the surfaces of the conducting elements 2 and 9 such that the second cross-over point $A_2'$ is attained. Also, the rear matrix surface 4 in FIG. 1 is charged so that its second cross-over point $B_2'$ is also reached. So long as the scanning beam is absent, the front surface assumes exactly or approximately the same potential. It assumes exactly the same potential in the case of a thru connection shown as element 2 in FIG. 1 or approximately the same potential in the case of a capacitive coupling across surfaces 3–4 or open condition 9–10. This is indicated by points $A_2$ and $B_2$ in the upper set of curves.

The instant when the scanning beam from gun 12 impinges a position, secondary electron emission occurs at that point. At the same time, the scanning beam discharges and shifts the potentials in the positive direction. As shown in FIG. 3, a threshold potential $V_T$ is chosen such that the secondary electrons from the conducting surfaces which are more negative ($A_2$) than the matrix surface ($B_2$) are detected. However, the secondary electrons from the matrix surface are not detected.

Where a thru connection exists, that is an intact via 2, discharging by the scanning beam occurs as a function of charging by the rear flood gun electrons. Hence, the potential shifts toward point $A_3$ as shown by the solid arrow on curve 31 in FIG. 3. It, however, remains below the threshold potential $V_T$.

In contrast, at points of interruptions, such as open condition 9–10, the scanning beam rapidly discharges and a potential rapidly exceeds the threshold potential $V_T$. No more secondary electrons emitted from these locations are detected. By this technique, thru connections can be distinguished from an open condition. A positive indication of these two circuit conditions can be attained.

By carefully adjusting the currents of the flood beam 12 and the scanning beam 14, together with the scanning speed, the signal becomes a continuous function of the resistance of the thru connection. The higher the resistance, the faster the potential is shifted to exceed the threshold potential $V_T$ by the discharging action of the scanning beam during its dwell on the surface of the element under test. This results in a smaller integrated signal occurring in the secondary electron detector. The output of the detector can be displayed on a monitor to view the pattern of secondary electron emission. Defective modules can then be reviewed as scanning takes place and those having defects can be discarded. In an automatic system, computer control of input and output of specimens would occur, coupled with a printout providing a listing of those specimens tested and the defects found.

Accordingly, the system in accordance with this invention allows for non-contact testing of greensheet material utilizing two beams. In essence, "writing" occurs with the flood beam directed to the rear of the specimen and "reading" occurs utilizing the scan beam. This technique is directly opposite to conventional storage tube systems. In those systems, the high energy beam is used for writing and a low energy flood gun is used to maintain a uniform charge level.

It is apparent that various modifications of this system may be utilized without departing from the essential scope of this invention.

We claim:

1. A method of testing electrical connections disposed through an insulating material without physical contact comprising the steps of:
    irradiating one side of said insulating material with a first electron beam to charge said material and said electrical connections to a given potential;
    generating a second electron beam on an opposite side of said material to cause secondary electron emission from connections which are at said given potential; and detecting the presence of connections not at a given potential.

2. A method of testing for continuity and open circuit conditions in electrical connections placed through an insulative material comprising the steps of:

flooding one side of said material with a broad angle, first electron beam;

scanning the opposite side of said material with a steerable second electron beam; and detecting the emission of secondary electrons emitted from said opposite surface to determine electrical conduction or interruption through said electrical connections.

3. A method of determining the status of electrical connections in an insulative layer without contacting said connections comprising the steps of:

charging without contacting one side of said insulative layer and said connections to a given potential using a first electron beam;

directing without contacting the opposite side of said layer a second electron beam to generate secondary electron emissions; and discriminating by detecting the variation in energy level of secondary electrons and their intensity to determine whether said electrical connections have electrical continuity or are open.

4. The method of claim 3 wherein the step of directing said second electron beam, without contacting, comprises stepping said second electron beam from a first predetermined point to a second predetermined point on said opposite side.

5. The method of claim 4 wherein said first and second predetermined points are locations of electrical connections in said insulative layer.

6. The method of claims 1, 2 or 3, further comprising the steps of providing a secondary electron detector outside the scan field of said second electron beam but at a position where it can be reached by secondary electrons generated from every position on said opposite side.

7. The method of claims 1, 2 or 3, wherein the energy level of said second electron beam is different from the energy level of said first electron beam.

8. The method of claim 7 wherein the energy level of said second electron beam is lower than the energy level of said first electron beam.

9. The method of claim 8 further comprising the step of producing voltage contrast by positioning a retarding electrode relative to said secondary electron detector to discriminate between electrons having different energies.

10. The method of claim 8 further comprising the steps of adjusting the currents of said first and second electron beams and the scanning speed of said second beam so that the output of a secondary electron detector is a continuous function of the resistance of said electrical connections.

11. Apparatus for testing electrical connections disposed through an insulating material specimen without physical contact, comprising:

means for generating a first electron beam to irradiate one surface of said specimen;

means for generating a second electron beam for irradiating a selected portion of an opposite surface of said specimen; and means for detecting the emission of secondary electrons at said selected portion to determine whether electrical continuity exists through said electrical connections.

12. The apparatus of claim 11 further comprising means to steer said second electron beam to different selected portions on said opposite surface.

13. The apparatus of claim 11 further comprising a holder for said specimen, said holder having a window to expose said one surface, and said first electron beam being a flood beam irradiating said one surface.

14. The apparatus of claim 11 wherein said means for detecting the emission of secondary electrons comprises a secondary electron detector positioned outside the field of said second beam but where it can be reached by secondary electrons generated at every selected position on said opposite surface.

15. The apparatus of claim 14 further comprising a retarding electrode positioned relative to said secondary electron detector to discriminate between electrons of different energies and produce a voltage contrast output.

16. The apparatus of claims 11 or 12, wherein said first electron beam is a flood beam having a different energy level than said second electron beam.

17. The apparatus of claim 16 wherein said flood beam has an energy level higher than said second electron beam.

* * * * *